Figure 1:
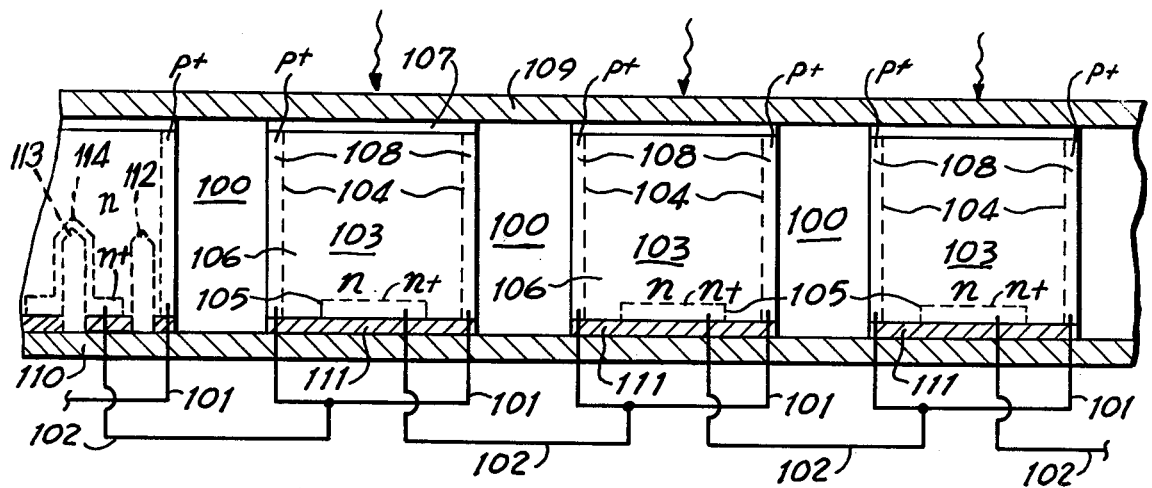

United States Patent [19]

Kaplow et al.

[11] 4,193,081

[45] Mar. 11, 1980

[54] MEANS FOR EFFECTING COOLING WITHIN ELEMENTS FOR A SOLAR CELL ARRAY

[75] Inventors: Roy Kaplow, Newton; Robert I. Frank, Lexington, both of Mass.

[73] Assignee: Massachusetts Institute of Technology, Cambridge, Mass.

[21] Appl. No.: 889,952

[22] Filed: Mar. 24, 1978

[51] Int. Cl.² .................... H01L 31/00; H01L 27/14
[52] U.S. Cl. ................................. 357/30; 357/81; 357/82; 136/89 P; 136/89 PC
[58] Field of Search ................ 357/30, 81, 82; 136/89 P, 89 PC

[56] References Cited

U.S. PATENT DOCUMENTS

| | | | |
|---|---|---|---|
| 2,919,298 | 12/1959 | Regnier et al. | 136/89 PC |
| 3,268,366 | 8/1966 | Guyot | 136/89 PC |
| 3,365,620 | 1/1968 | Butler et al. | 357/82 |
| 3,812,404 | 5/1974 | Barkan et al. | 357/82 |
| 3,972,063 | 7/1976 | Kimura et al. | 357/82 |
| 3,976,508 | 8/1976 | Milavsky | 136/89 PC |
| 4,021,323 | 5/1977 | Kilby et al. | 136/89 PC |
| 4,106,952 | 8/1978 | Kravitz | 357/30 |
| 4,128,732 | 12/1978 | Kaplow et al. | 357/30 |
| 4,129,458 | 12/1978 | Kaplow et al. | 357/30 |

*Primary Examiner*—Andrew J. James
*Attorney, Agent, or Firm*—Hopgood, Calimafde, Kalil, Blaustein & Lieberman

[57] ABSTRACT

A solar cell array, comprised of a plurality of series-connected unit solar cells, formed from a common substrate, is cooled by providing cooling passages between adjacent sidewalls of adjoining unit cells through which a heat transfer medium is transmitted. Transmission of the heat transfer medium through the passages effectively cools the solar cell array as the cooling surfaces provided by the sidewalls of the cooling passages are much larger than the light-receiving surfaces of the cells. Enhanced cooling effectiveness can be accomplished by providing additional cooling passages along the lower surfaces of the unit cells.

16 Claims, 3 Drawing Figures

MEANS FOR EFFECTING COOLING WITHIN ELEMENTS FOR A SOLAR CELL ARRAY

This invention relates to solar or photovoltaic cells and more particularly to a solar cell construction uniquely designed to allow efficient cooling of a solar cell array.

Fossil fuels have, in the past, provided the bulk of the world's energy needs. However, as the price of fossil fuels has increased and their supply decreased, increasing attention has been directed towards the development of alternate energy sources. Once such alternate energy source is the solar cell which directly converts the energy from the sun into usable electrical power.

Solar cells have been long used in prior art solar energy systems, and presently known solar cells are commonly of two types. The first type is the planar solar cell which consists of a large area p-n junction typically formed in a wafer of monocrystalline material such as silicon. The junction is formed parallel to the upper surface of the cell and this upper surface receives incident radiation from the sun which produces current flow across the p-n junction in a well-known manner. Planar solar cells suffer from several disadvantages, one of which is the fact that planar solar cells are not readily adaptable for efficient operation at high concentrations of incident light. A solar cell which is more suited to operation at high concentrations of incident light is the vertical junction solar cell.

The vertical junction solar cell may be fabricated from stacks of silicon wafers which have been appropriately doped to form p+ and n+ surface layers on opposite sides of the wafers and the wafers are then stacked and sintered together. The wafers are sliced into segments to create a plurality of solar cells with p-n junctions normal to the cell surface. With silicon, the resultant vertical junction solar cell has the potential for efficient high intensity operation.

It is well known that the conversion efficiency of solar cell devices, i.e., their efficiency in converting light into electricity, decreases as the temperature of the solar cell device increases. Conversion efficiency is particularly affected by high temperatures in the vicinity of the p-n junction of the vertical junction solar cell. Therefore, although vertical junction solar cells are adaptable for high intensity operation, the high intensity operation itself causes an increase in device temperature if the device is not cooled, which results in a conversion efficiency for the solar cell which is less than that which would be achieved at lower temperatures and at the same intensity. The lower conversion efficiency reduces the effectiveness of the cell, thus making the cell less desirable for high intensity operation.

It is therefore an object of this invention to provide a solar cell which is capable of operating in the presence of high intensity radiation without a significant reduction in the conversion efficiency of the solar cell device due to increases in temperature.

It is often desirable in solar cell applications to extract not only electrical energy from the solar cell device, but also to extract useful heat from the device which is generated by the solar radiation applied thereto. In order to extract useful heat from the solar cell device it is necessary to operate the cell at an elevated average temperature. However, as described above, the greater the average temperatures of the device, especially in the vicinity of the p-n junction, the lower the conversion efficiency of the device in converting sunlight into electricity. Therefore, in the prior art, the desire to extract useful heat from the device resulted in the disadvantage that as the temperature increased, electrical energy output decreased, due to the elevated temperature of the solar cell's p-n junction.

It is therefore, another object of this invention to maintain the temperature in one region of a solar cell device, i.e. near the p-n junction, different from the surface temperature of the device.

It is a further and general object of this invention to provide a solar cell capable of operating at high concentrations of incident light while simultaneously providing for the dissipation of excess heat.

In accordance with the invention individual solar cell units are formed from a common substrate and the body material of each of the units formed from the substrate advantageously has the same spaced relation to the body material of each of the other units as existed in the original substrate. Each unit has spaced elongate sidewalls and an active light receiving area extending between the opposite sidewalls of each individual unit. Adjacent sidewalls of adjoining units have therebetween an elongate passage adapted for the transmission of a heat transfer medium.

It is a feature of the invention that the transmission of a heat transfer medium between adjacent sidewalls of adjoining units advantageously maintains the temperature at the p-n junction area of the solar cell at a reduced level, thereby allowing efficient operation of the solar cell unit.

It is a further feature of the invention that the effective surface area available for the transfer of heat from the cell, to the heat transfer medium, is many times greater than the area of the cell which is exposed to incident radiation.

It is an additional feature of the invention that the interior of the cell and the cell junction may be within a few mils, or less, of the heat transfer medium.

In accordance with another aspect of the invention, a second passage adapted for the transmission of a heat transfer medium is arranged adjacent to the lower surface of each solar cell unit and the transmission of a heat transfer medium through the second passage allows for enhanced cooling of the solar cell device.

It is a further feature of the invention that the temperature of the heat transfer medium in the second passage may be different than the temperature of the heat transfer medium in the first passage.

In accordance with another aspect of the invention the passages, extending between the adjacent sidewalls of adjoining units, consist of a first passage portion extending from the lower surface of the cell to a point close to but short of the upper surface and a second substantially smaller passage portion connected to the first passage portion and extending from the point to the upper surface of the cell.

It is a further feature of the invention that the substantially smaller passage portion may be sealed to allow for the transmission of a heat transfer medium via the first passage portion.

Figure 2:
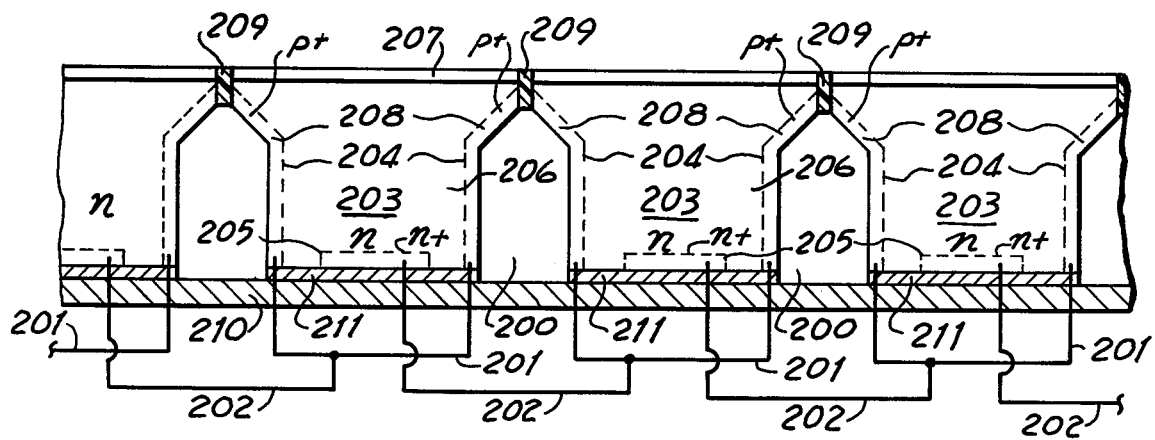
Figure 3:
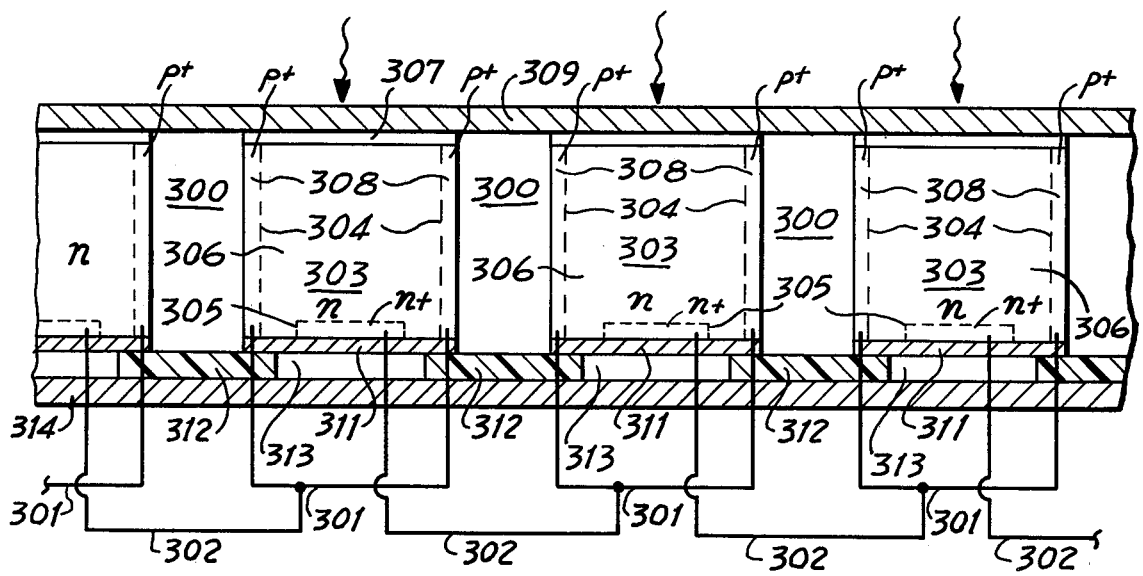

To the accomplishment of the above, and to objects that may hereinafter appear the present invention relates to solar cell cooling as defined in the appended claims and as described in the following specifications when considered in conjunction with the accompanying drawings in which:

FIG. 1 is a schematic diagram, as viewed in the cross section, of a solar cell designed for effective cooling in accordance with the instant invention, FIG. 2 is another aspect of the instant invention in which a cooling passage includes a first passage portion for the transmission of the heat transfer medium and a second substantially smaller passage portion which may be sealed to contain the heat transfer medium within the first passage porition, and FIG. 3 illustrates a further embodiment of the invention in which additional cooling passages are provided.

The embodiments of the invention described hereinbelow illustrate a solar cell which has an n-type silicon substrate. It is to be understood however, that the solar cell of the invention may also be implemented with a substrate of p-type polarity in which case the polarity of the other regions in the cell will be reversed with n replaced by p, n+ replaced by p+ and so on. It will also be understood that other types of semiconductor material may be employed and that a heretojunction as well as the homojunction structure described may be employed.

Refer to FIG. 1 wherein is illustrated a solar cell which is one particular embodiment of a solid state cell described in our copending application, Ser. No. 689,989, filed May 26, 1976, and entitled "High Intensity Solid State Solar Cell". More particularly, the solar cell illustrated in FIG. 1 consists of a series of individual solar cells 103 each of which are formed from a single wafer of semiconductor material. The unit solar cells are subsequently connected in series with other unit solar cells or the unit solar cells can be arranged in series-connected subunits which are later connected in parallel. Each of unit solar cells 103, illustrated in FIG. 1, are comprised of an n-type substrate 106. The unit solar cells are separated from one another by passages 100 which are formed by anisotropic etching to create passages having straight parallel walls extending completely through the common substrate. p+ regions 108 are formed along the wall of each passage and an n+ region 105 is formed along the lower surface of each unit cell. An oxide layer 111 is formed on the lower surface of each cell and a passivation and antireflective coating 107 is formed on the upper surface of each cell. Cell construction is completed by interconnecting the p+ regions of each cell with a first connection schematically indicated at 101 and connecting the n+ regions of the cell to the p+ regions of adjacent cells with a second connection schematically indicated at 102. Series-parallel combination connections are also possible, of course.

Light is incident on the upper surface of each cell and the incident light causes a flow of carriers across p-n junction 104, (formed by the p+ region and the n-type substrate) to the n+ region, and from the latter to the p+ regions in succeeding solar cells via connections 102. The conduction of current proceeds in series across the individual solar cells to a current collector (not shown). The connections indicated schematically in FIG. 1 are, of course, illustrations of actual connections between adjacent cells wherein such actual connections may be formed by known selective etching and metalization techniques or other microelectronic techniques.

The solar cell illustrated in FIG. 1 is specifically designed to be operable at high concentrations of incident light. The presence of high intensity radiation on the upper surface of the cell raises the temperature of each solar cell unit and the increase in temperature results in a reduction in the conversion efficiency compared to the efficiency which would be obtained at the same intensity but at a reduced temperature. As described above, it is desirable to maintain the temperature, especially near the p-n junction of each solar cell unit, at a reduced value such that the solar cell can operate at maximum conversion efficiency.

Maintaining a reduced temperature near the p-n junction is readily achieved with the instant invention. More particularly, grooves 100, which provide passages between adjacent solar cell units, are left open, thereby providing a passage extending between each solar cell unit. The existence of passages 100 between adjacent solar cell units provides a ready and advantageous means of maintaining the temperature near the p-n junction at a reduced value by utilizing passages 100 for the transmission of a heat transfer medium between adjacent solar cell units.

Utilization of passages 100 for the transmission of a heat transfer medium is accomplished by sealing the upper aperture of the passages with a transparent blocking wall. Such a seal is provided, for example, by the provision of glass layer 109 (a glass plate or sheet) which can be attached to the upper surface of the cell with a transparent adhesive to thereby seal the upper aperture of passages 100. A similar glass layer 110 is sealed across the lower aperture of passages 100. Therefore, the provision of glass layer 109 over the upper surface of the cell and the provision of glass layer 110 over the lower surface of the cell seals the upper and lower apertures of passages 100 thereby allowing for the transmission of a heat transfer medium throughout the passages. Incident light is allowed to reach each unit cell due to the transparent nature of blocking wall 109. Conventional means, not shown, can be utilized in a well known manner to transmit a heat transfer medium throughout passages 100 and the heat transfer medium can be of any type including both liquids and gasses. It can be appreciated that for the embodiment shown in FIG. 1 that the sidewalls of passages 100 must be electrically insulated from the heat transfer medium or the heat transfer medium must be electrically non-conductive in order to maintain the electrical isolation between unit cells. Passive (i.e., convective) flow methods can also be used with the use of fins extending from the backs of the unit cells being applicable to passive flow methods.

It is anticipated that the geometry and spacing of the unit cells illustrated in FIG. 1 will be selected in accordance with the teachings in our copending application, entitled "Improved Solar Cell", Ser. No. 824,974, filed Aug. 15, 1977. More particularly, unit cell which (i.e., active area) may be approximately 4.0 mils while cell thickness may be approximately 10 mils. Therefore, as each unit cell is cooled from two sides, there will be an effective cooling surface of 20 mils for each 4 mils of heating area (i.e., active light receiving surface) and in addition, the junction and the interior of the cell is no more than a few mils from the heat transfer medium. What is accomplished therefore is the provision of an effective heat transfer surface with a cooling to heating area ratio of approximately 5 to 1 (20 mils cooling area to 4 mils heating area). The result is that the effective surface area available for the transfer of heat is many times the area exposed to the incident radiation and the cell design is, in effect, a miniature heat exchanger. The effectiveness of the heat transfer surface also depends on the fact that silicon is a good thermal conductor so that heat will be conducted down through the unit cell and out the sides to the heat transfer medium. This is in contrast to conventional cooling methods wherein the cooling medium is at a much greater distance from the light-receiving surface, i.e., the cooling medium is typically directed along the back or lower surface of the solar cell which results in a cooling to heating ratio of 1:1. The cooling to heating area ratio described above is only exemplary and this ratio can, of course, be greater or smaller in accordance with selected cell dimensions.

It is clear that the transmission of a heat transfer medium through passages 100 will serve to reduce the device temperature in the area of p-n junctions 104. More particularly, the heat from the high temperature area on the active light receiving area of the cell will propagate through the n region and p+ region to the low temperature area of passages 100 thereby transferring heat away from the p-n junctions. This serves to reduce the temperature of the p-n junctions and ensures that conversion efficiency is enhanced as the junction temperature is maintained at a reduced level. The amount of heat transfer is, of course, dependent on the type of heat transfer medium, the flow rate of the heat transfer medium, and the thermal conductivity of n type regions 106 and p+ regions 108.

In order to dissipate heat from the device it is desirable to maintain the temperature at the junction (T104) at a level which is less than the surface temperature of the solar cell device (T103). This requirement leads to the following relationship between the various temperatures, wherein T108 is the temperature of the p+ areas 108, and T100 is the temperature of the heat transfer medium in passages 100. The required relationship is:

$$T103 > T104 > T108 > T100$$

The foregoing relationship between the various temperature of the device can be accomplished by providing a heat transfer medium flow via passages 100 at a different and lower temperature than the surface temperature of the device. It can readily be appreciated that this difference in temperature can be achieved by utilization of different types of heat transfer mediums or by transmitting the mediums at different flow rates. From the foregoing it can be seen that, by transmitting a heat transfer medium through passages 100 the temperature in the junction area is maintained at a value which is less than the surface temperature of the solar cell device thereby allowing the junction to operate at maximum conversion efficiency. The instant invention therefore, advantageously accomplishes the requirements described above, namely the maintenance of the junction temperature at a low value for maximum conversion efficiency.

It is to be understood that the reduction of heat in the junction area can be enhanced by utilizing specific material properties and region configurations to maximize the thermal transfer rate from the junction area to passages 100. This can be accomplished, for example, by minimizing the thickness of the p+ area 108, and by designing the chemical constituency and thermal structure of region 108 such that it has high thermal conductivity. In addition, the thermal conductivity of various anistropic materials can be chosen to allow region 106 to have a high thermal conductivity in the horizontal direction from area 106 to the junction area. Although specific materials necessary to achieve the thermal conductivity are not identified at this time it is to be understood that the effectiveness of the invention can be enhanced through utilization of such materials.

It is appreciated that means must be provided for structural and maintenance of subunit alignment during fabrication of the device since passages 100 are left open during construction. Methods of constructing such a solar cell device with open passages existing between adjacent solar cell units is discussed in our copending application Ser. No. 796,657, entitled "Method of Making a High Intensity Solid State Solar Cell" filed May 13, 1977. Fabrication of the cell of the instant invention is essentially in accordance with the teachings outlined in Ser. No. 796,657. However, due to the fact that transparent plates 109 and 110 must be affixed to the cell, to seal the passage apertures, certain variations in the fabrication procedure should be noted. More particularly, fabricated is generally in accordance with Example I in Ser. No. 796,657 and after etching, one sealing plate is bonded to the front of the cell prior to severance of the wafer material to provide electrical isolation of the unit cells. Required interconnections are also made on the back of the cell as illustrated in Ser. No. 796,657, and subsequent thereto, the back sealing plate is affixed to the back of the cell. It is to be understood that the interconnection process may leave protrusions on the lower surface of the cell such that the back plate will not effectively provide a seal between the cooling passages. In this instance epoxy may be utilized during the sealing process to prevent leakage between adjacent cooling passages. The foregoing illustrates that the plates affixed to the cell are utilized to maintain correct spacing and orientation between cell-body elements and that filling of the groove space is not required to maintain sub-unit alignment.

FIG. 2 illustrates a second embodiment of the invention. Shown in FIG. 2 is n-type silicon substrate 206 from which is created a plurality of individual unit solar cells. The unit solar cells are all created from common substrate 206 and the body material of each cell unit advantageously has the same physical properties and crystallographic orientation in the finished cell structure that existed in the original substrate. A procedure for fabricating cells from a common substrate is described in detail in our copending application Ser. No. 689,989 and Ser. No. 796,657. Therefore, the details of the fabrication will not be repeated here, but it is understood that the fabrication techniques described in these copending applications can be utilized in the fabrication of the solar cell of the instant invention.

Referring to FIG. 2 it can be seen that substrate 206 has etched therein a plurality of passages consisting of a lower passage portion 200 and a substantially smaller passage portion 209. The manner of etching a passage of this type between adjacent unit solar cells is described in detail in our copending application Ser. No. 824,974 entitled "Improved Solar Cell" and filed Aug. 15, 1977. The details of fabrication will not be repeated here but as is described in that copending application passages 200 and 209 are formed in a two-step process. Initially, passage portion 200 is etched into the substrate to form a groove having vertical sidewalls, which is a property of anisotropic etching in silicon having a <110> surface orientation. Subsequent to the etching of passage portion 200, p+ regions 208 are formed along the walls of each groove by diffusion. The diffusions follow the groove contours thereby forming p-n junction 204 completely around each groove between the p+ region and the n-type substrate. N+ regions are also formed along the lower surface of each unit solar cell at 205 in the same manner as was described in conjunction with FIG. 1. Subsequent to the diffusion process a plurality of unit solar cells 203 exists in the substrate requiring only final separation and connection to form completed cells.

Separation of each unit solar cell is achieved with narrow passage portions 209. These narrow portions are etched from the upper surface of the substrate to connect with the wider passage portions 200 which were etched in the lower surface of the substrate. Cell construction can be completed by filling the narrow portion of passage 209 only while the wide passage portion 200 is left completely open. Passage portions 209 can be filled with an insulating material to provide electrical isolation of the cells with the insulating material being indicated by shading within passage portion 209. It is readily understood that filling passage portions 209 with an electrical insulator also provides an impervious seal allowing passage portion 200 to be used as a passage for a cooling medium. Alternatively passage portion 209 can be sealed with a transparent blocking wall 109 described above in conjunction with FIG. 1. Affixing the blocking walls to the cell in the proper sequence during fabrication of the cell ensures that means are provided for structural support and maintenance of subunit alignment during cell fabrication as has been described above. Utilization of passage portion 200 as a passage for a heat transfer medium requires, of course, that the lower aperture of passage portion 200 be sealed with glass layer 210 or other material as has been described above in accordance with FIG. 1.

Interconnection of the various unit solar cells is achieved by interconnecting the p+ region 208 of each unit cell with a first connection schematically indicated at 201 and by connecting the n+ regions 205 of one cell to the p+ regions of adjacent cells with the schematic connection indicated at 202. It should be recognized that series-parallel combination connections can be made as well. The direction of the flow of carriers to each subunit in response to incident light, is as ordinarily understood for p+ and n+ silicon cells. The antireflection coating 207 and the oxide layer 211 previously described is also shown in FIG. 2.

The configuration shown in FIG. 2 provides a passage for the transmission of a heat transfer medium indicated at 200. The difference between the configuration shown in FIG. 1 and that shown in FIG. 2 is that cooling passage 200 between adjacent cells is sealed in FIG. 1 with a glass layer while the cooling passage in FIG. 2 can be sealed by filling passage portion 209 with an electrical insulator. Passage 200 is utilized in the same manner as was described above for passage 100 to provide the reduction in temperature in the junction area.

As described above in accordance with FIG. 1, providing passages 100 between adjacent solar cell units in the vicinity of the p-n junctions readily allows the average temperature in the area of the p-n junctions to be maintained at a reduced value thereby increasing the conversion efficiency of the device. However, it may also be desired to provide additional cooling passages or to perhaps provide for differential cooling of the unit solar cells. This can be accomplished by the provision of an additional passage arranged on the lower surface of each solar cell unit. More particularly, referring to FIG. 3 passages 313 are formed by attaching thermal insulators 312 to the lower surface of the cell and then sealing a second glass layer 314 over the entire configuration of passages 313 and thermal insulators 312 to provide an impervious seal for passages 313 and to retain insulators 312 in a fixed position between passages 313 and 300. Insulators 312 provide thermal insulation between passages 300 and passages 313 and may be used to maintain a temperature differential between the two passages. Passages 313 could also be formed by etching the passages into glass layer 314 with any known selective etching technique. Thermal insulators 312 would then consist of a portion of glass layer 314 and the entire configuration would be attached to the lower surface of the cell. It is clear that additional cooling for the unit solar cells can be provided by the transmission of an additional heat transfer medium through passages 313. In addition, it can be appreciated that if the heat transfer medium transmitted through passages 313 is maintained at a different temperature than the temperature of the heat transfer medium in passages 300 differential cooling will be provided wherein the temperature in passages 300 will be different than the temperature in passages 313.

The instant invention provides a means for cooling solar cells by providing a cooling passage between adjacent unit solar cells which advantageously reduces the temperature in the junction area to allow maximum conversion efficiency of the cell. In addition, a second cooling passage can be provided on the lower surface of each solar cell to thereby allow for additional cooling or differential cooling of the solar cell device. Thermal insulation is provided between the two passages to allow a temperature differential to exist. It should also be appreciated that the thermal properties of various materials can be utilized to enhance the effectiveness of the device in providing cooling.

The above discussion has indicated that enhanced cooling can be achieved by providing cooling passages between adjacent unit cells and by providing cooling passages adjacent to the lower surface of the unit cells. Enhanced cooling can also be provided by etching cooling passages into the lower surface of the unit cell. More particularly, FIG. 1 illustrates cooling passages 112 and 113 etched into the lower surface of a unit cell with any known selective etching technique. Cooling passage 112 extends from the lower surface of oxide layer 111 up into the n region of the unit cell, while cooling passage 113 extends from the lower surface of oxide layer 111 up through the n+ region of the unit cell. Dotted line 114 illustrates the fact that n+ region 105 would follow the contour of cooling passage 113 in the same manner that p+ region 208 follows the contour of cooling passage 200.

The lower apertures of passages 112 and 113 would be sealed with blocking wall 110 in the same manner blocking wall 110 is utilized to seal the lower apertures of passages 100 and 200. Conventional means, not shown, would also be utilized to transmit a heat transfer medium throughout passages 112 and 113 in the same manner that a heat transfer medium is transmitted through passages 100 and 200 and the heat transfer medium can be of any type including both liquids and gases. It is to be understood that cooling passages 112 and/or 113 could be etched into the lower surface of one or more of the unit cells with the number of lower surface passages utilized being dependent on the amount of cooling required.

Although a specific embodiment of this invention has been shown and described it will be understood that various modifications may be made without departing from the spirit of the invention.

We claim:

1. A semiconductor solar cell comprising spaced elongate parallel units formed from a common substrate and comprised of a first conductivity type, the body material of each of said units having the same spaced relation to the body material of other of said units as existed in the original substrate from which they are formed, each unit having upstanding sidewalls and having therebetween an upper surface adapted for exposure to receive incident radiation, and a lower surface, adjacent sidewalls of adjoining units having therebetween a first elongate passage adapted for the transmission of a heat transfer medium, each unit sidewall comprised of a localized region of a second conductivity type and ohmic connections extending between the second conductivity type region of one unit and the first conductivity type region of an adjacent unit, whereby the transmission of a heat transfer medium between the adjacent sidewalls of adjoining units maintains the temperature at said localized region of a second conductivity type less than the upper surface temperature of the semiconductor solar cell.

2. A semiconductor solar cell in accordance with claim 1, wherein a second elongate passage adapted for the transmission of a heat transfer medium may be formed adjacent to the lower surface of each unit solar cell.

3. A semiconductor solar cell in accordance with claim 1, wherein a ratio between the surface area of the sidewalls of the first elongate passage and the upper surface area may be at least approximately 2:1.

4. A semiconductor solar cell in accordance with claim 2, wherein thermal insulation may be provided between the first elongate passage and the second elongate passage to maintain a temperature differential between said first and second passages.

5. A semiconductor solar cell in accordance with claim 3, wherein said first passage includes upper and lower apertures, said upper and lower apertures being sealed with blocking walls, whereby said first passage is adapted to allow for the transmission of a heat transfer medium therethrough.

6. A semiconductor solar cell in accordance with claim 5, wherein said second passage is formed adjacent to the lower aperture of said first passage.

7. A semiconductor solar cell comprising spaced elongate parallel units formed from a common substrate and comprised of a first conductivity type, the body material of each of said units having the same spaced relation to the body material of other of said units as existed in the original substrate from which they are formed, each unit having upstanding sidewalls and having therebetween an upper surface adapted for exposure to receive incident radiation, and a lower surface, a first elongate passage adapted for the transmission of a heat transfer medium formed adjacent to the lower surface of each unit solar cell, each unit sidewall comprised of a localized region of a second conductivity type and ohmic connections extending between the second conductivity type region of one unit and first conductivity type region of an adjacent unit; whereby the transmission of a heat transfer medium through the first elongate passage allows for the dissipation of excess heat from the solar cell.

8. A semiconductor solar cell in accordance with claim 7, wherein a second elongate passage adapted for the transmission of a heat transfer medium is formed between adjacent sidewalls of adjoining units.

9. A semiconductor solar cell in accordance with claim 8, wherein thermal insulation may be provided between said first passage and said second passage to thereby maintain a temperature differential between said first and second passages.

10. A semiconductor solar cell comprising spaced elongate parallel units formed from a common substrate and comprised of a first conductivity type, the body material of each of said units having the same spaced relation to the body material of other of said units as existed in the original substrate from which they are formed, each unit having upstanding sidewalls, and having therebetween an upper surface adapted for exposure to receive incident radiation and a lower surface, adjacent sidewalls of adjoining units having therebetween an elongate passage adapted for the transmission of a heat transfer medium therethrough, said adjacent sidewalls having a surface area substantially greater than the surface area of said upper surface, each unit sidewall comprised of a localized region of a second conductivity type and ohmic connections extending between the second conductivity type region of one unit and the first conductivity type region of an adjacent unit.

11. A semiconductor solar cell in accordance with claim 10, wherein upper and lower apertures of said passage are sealed with a blocking wall.

12. A semiconductor solar cell comprising spaced elongate parallel units formed from a common substrate and comprised of a first conductivity type, the body material of each of said units having the same spaced relation to the body material of other said units as existed in the original substrate from which they are formed, each unit having upstanding sidewalls, and having therebetween an upper surface adapted for exposure to receive incident radiation and a lower surface, adjacent sidewalls of adjoining units having therebetween a first passage portion extending from an aperture at said lower surface to a point close to but short of said upper surface and a second substantially smaller passage portion connected to said first passage portion and extending from the point to the upper surface, said second passage portion and said aperture being filled with a blocking wall, thereby said first passage portion is adapted for the transmission of a heat transfer medium, each unit sidewall comprsied of a localized region of a second conductivity type and ohmic connections extending between the second conductivity type region of one unit and the first conductivity type region of an adjacent unit.

13. A semiconductor solar cell in accordance with claim 12, wherein a second passage adapted for the transmission of a heat extraction medium may be formed adjacent to the lower surface of each unit solar cell.

14. A semiconductor solar cell in accordance with claim 13, wherein thermal insulation may be provided between said first passage portion and said second passage to maintain a temperature differential between said first passage portion and said second passage.

15. A semiconductor solar cell in accordance with claim 14, wherein said second passage is etched into the blocking wall affixed to the lower aperture of said first passage.

16. A semiconductor solar cell having an upper surface adapted for exposure to receive incident radiation and a lower surface, said lower surface having formed therein a plurality of elongate passages, said passages extending in the vertical direction from an aperture in said lower surface to a point short of said upper surface, a blocking wall for sealing said lower surface apertures and means for transmitting a heat transfer medium through said elongate passages, whereby the transmission of a heat transfer medium through said elongate passages allows for the dissipation of excess heat from the solar cell.

* * * * *